United States Patent
Lee et al.

(10) Patent No.: US 10,297,735 B2
(45) Date of Patent: May 21, 2019

(54) LIGHT EMITTING DEVICE PACKAGE

(71) Applicant: LG INNOTEK CO., LTD., Seoul (KR)

(72) Inventors: Mi Jin Lee, Seoul (KR); Min Jae Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/757,563

(22) PCT Filed: Mar. 15, 2016

(86) PCT No.: PCT/KR2016/002552
§ 371 (c)(1),
(2) Date: Mar. 5, 2018

(87) PCT Pub. No.: WO2017/039097
PCT Pub. Date: Mar. 9, 2017

(65) Prior Publication Data
US 2018/0254393 A1   Sep. 6, 2018

(30) Foreign Application Priority Data
Sep. 3, 2015   (KR) .................... 10-2015-0125080

(51) Int. Cl.
*H01L 33/62*   (2010.01)
*H01L 25/16*   (2006.01)
(Continued)

(52) U.S. Cl.
CPC ............ *H01L 33/62* (2013.01); *H01L 25/167* (2013.01); *H01L 29/866* (2013.01); *H01L 33/105* (2013.01); *H01L 33/486* (2013.01)

(58) Field of Classification Search
CPC ..... H01L 33/62; H01L 33/105; H01L 25/167; H01L 29/866
See application file for complete search history.

(56) References Cited

U.S. PATENT DOCUMENTS

2014/0117403 A1 * 5/2014 Hayashi .............. H01L 33/62
257/99

FOREIGN PATENT DOCUMENTS

JP   2014-093323   5/2014
JP   2015-041685   3/2015
(Continued)

OTHER PUBLICATIONS

International Search Report and Written Opinion dated Jun. 15, 2016 issued in Application No. PCT/KR2016/002552 (Full English Text).

*Primary Examiner* — Selim U Ahmed
(74) *Attorney, Agent, or Firm* — KED & Associates, LLP

(57) ABSTRACT

Embodiments relate to a light emitting device package having an improved luminous flux, and the light emitting device package includes a body including a cavity, a first lead frame and a second lead frame exposed on a bottom surface of the cavity and separate from each other by an electrode separating member, a first light emitting device disposed on the first lead frame, a second light emitting device disposed on the second lead frame, and a Zener diode disposed on the first lead frame or the second lead frame, and disposed more closely to the electrode separating member than to the first light emitting device and the second light emitting device. Here, the electrode separating member diagonally separate the first lead frame and the second lead frame along a width direction of the body.

17 Claims, 4 Drawing Sheets

(51) Int. Cl.
*H01L 29/866* (2006.01)
*H01L 33/10* (2010.01)
*H01L 33/48* (2010.01)

(56) References Cited

FOREIGN PATENT DOCUMENTS

| KR | 10-2013-0013956 | 2/2013 |
| KR | 10-2014-0026877 | 3/2014 |
| KR | 10-2014-0095914 | 8/2014 |

\* cited by examiner

[Fig. 1A]
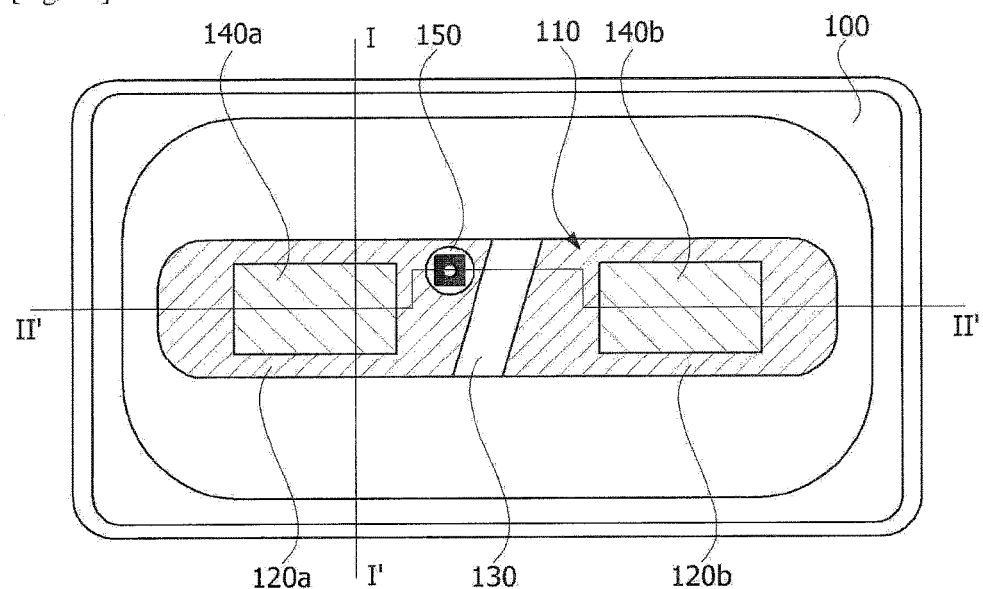
[Fig. 1B]
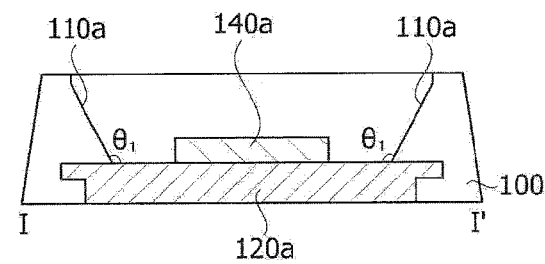
[Fig. 1C]
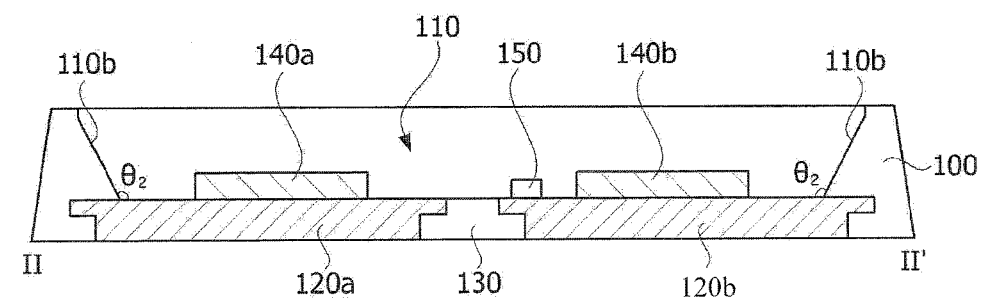

[Fig. 1D]
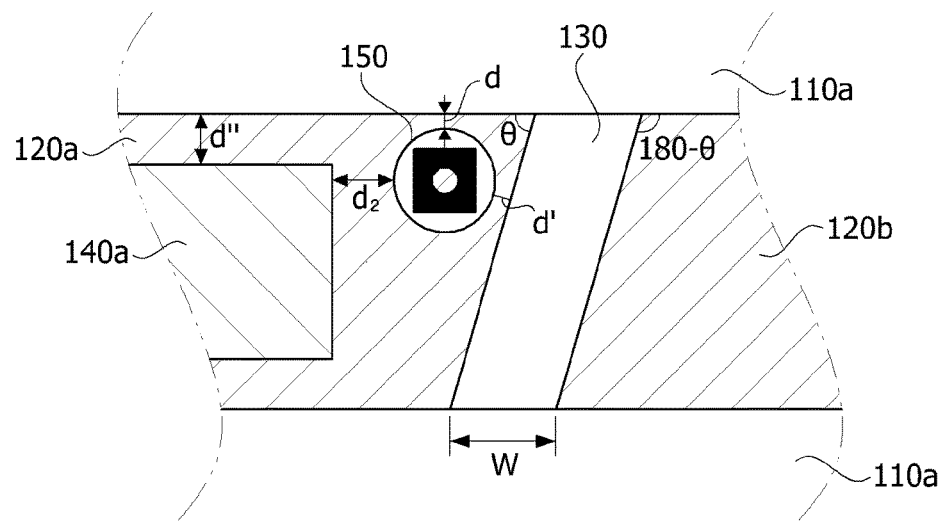
[Fig. 2]
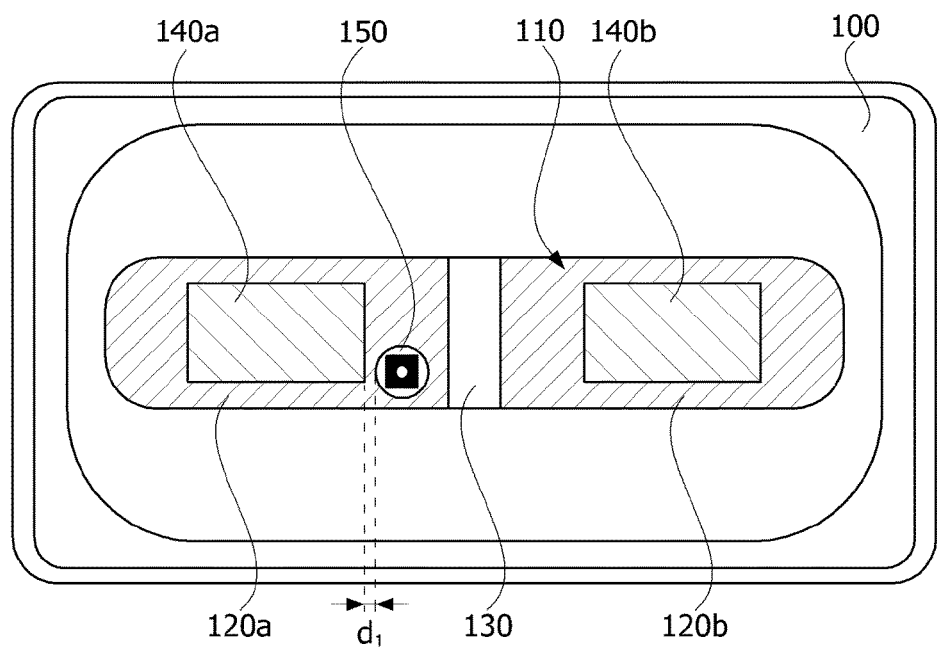

[Fig. 3]
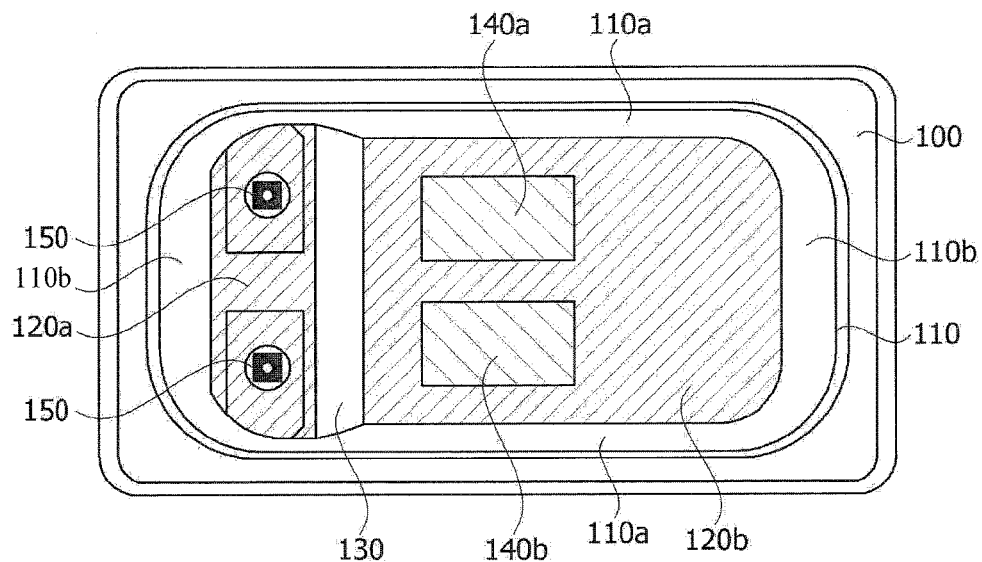
[Fig. 4]
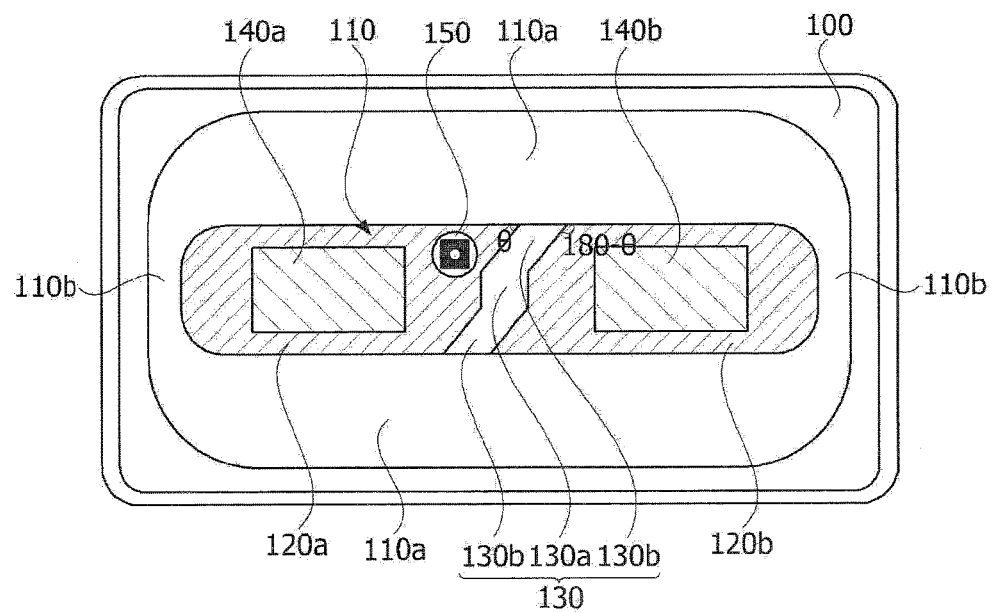

[Fig. 5A]
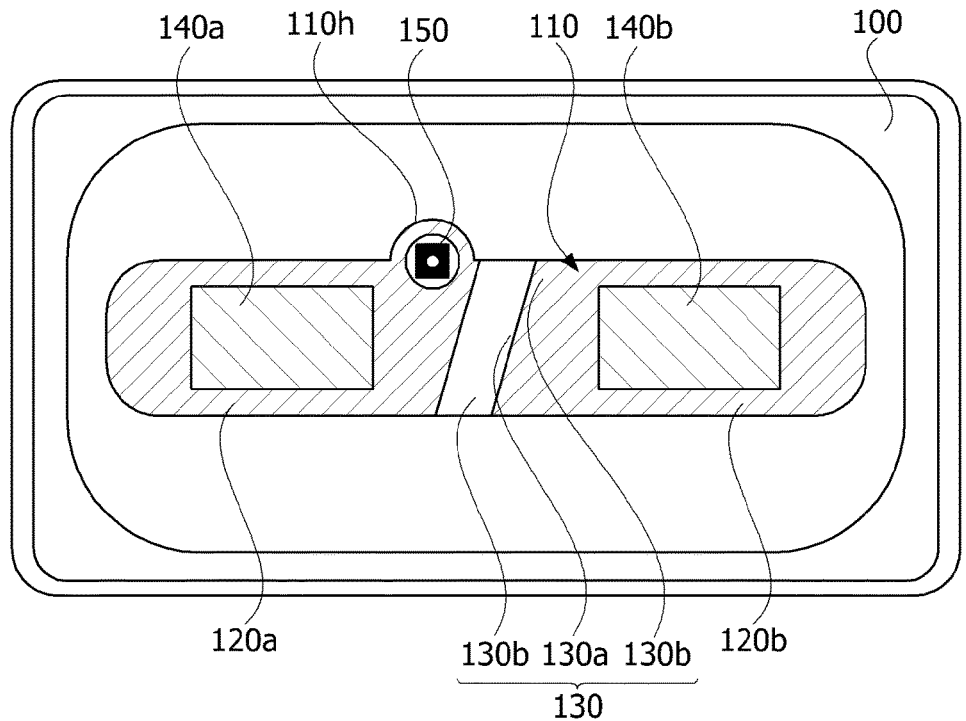
[Fig. 5B]
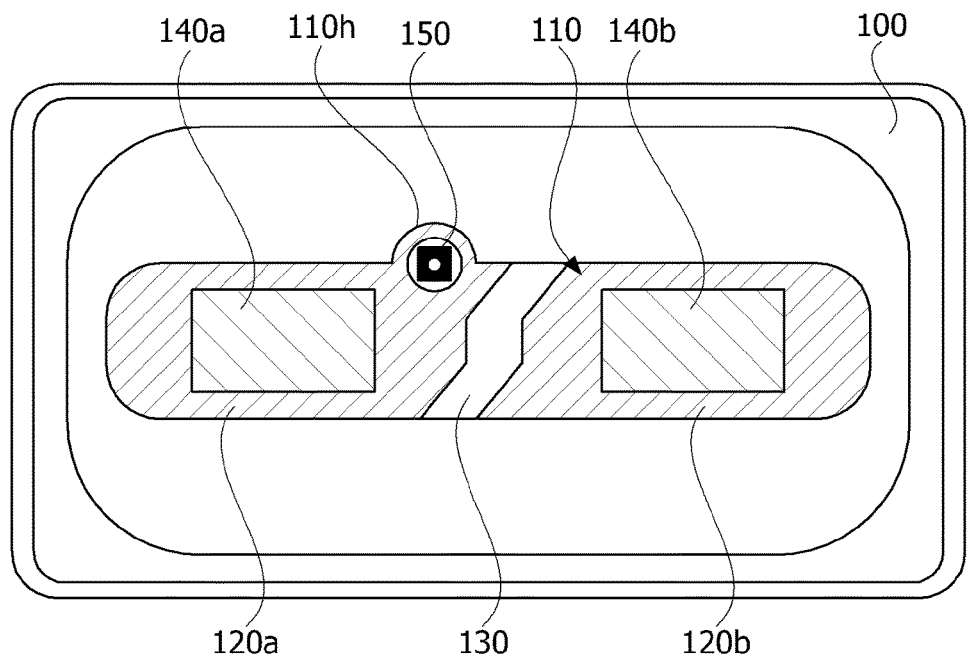

LIGHT EMITTING DEVICE PACKAGE

CROSS-REFERENCE TO RELATED PATENT APPLICATIONS

This application is a U.S. National Stage Application under 35 U.S.C. § 371 of PCT Application No. PCT/KR2016/002552, filed Mar. 15, 2016, which claims priority to Korean Patent Application No. 10-2015-0125080, filed Sep. 3, 2015, whose entire disclosures are hereby incorporated by reference.

TECHNICAL FIELD

The present invention relates to a light emitting device package having an improved luminous flux.

BACKGROUND ART

A light emitting diode (LED) is one type of light emitting devices which emits light when a current is applied. The LED can emit light of a high efficiency with a low voltage, so that an energy saving effect is excellent. Recently, a problem of brightness of the LED has largely been resolved, and the LED is applied to various devices such as a backlight unit of a liquid crystal display device, an electronic board, an indicator, home appliances, etc.

The LED may be a structure in which a first electrode and a second electrode are disposed on one side of a light emitting structure comprising a first semiconductor layer, an active layer, and a second semiconductor layer. The first electrode and the second electrode are electrically connected to a first pad and a second pad, respectively. Further, the first pad and the second pad can be connected to a lead frame or mounted on a printed circuit board, etc. using a bonding layer.

The LED as described above may be used as a light source for a display, a light source for a car, and a light source for illumination, and a light emitting diode package emitting a white light may be formed using the LED and a fluorescent substance.

DISCLOSURE OF INVENTION

Technical Problem

The present invention aims to provide a light emitting device package capable of improving a luminous flux.

Solution to Problem

According to one aspect of the present invention, a light emitting device package includes a body including a cavity, a first lead frame and a second lead frame exposed on a bottom surface of the cavity and separated from each other by an electrode separating member, a first light emitting device disposed on the first lead frame, a second light emitting device disposed on the second lead frame, and a Zener diode disposed on the first lead frame or the second lead frame and disposed closer to the electrode separating member than to the first light emitting device and the second light emitting device. Here, the electrode separating member diagonally separates the first lead frame and the second lead frame along a width direction of the body.

Here, the first light emitting device and the second light emitting device may be disposed in parallel to a length direction of the body.

Further, a first inclination angle between the bottom surface of the cavity and a first inside surface of the body formed along a length direction of the body may be greater than a second inclination angle between the bottom surface of the cavity and a second inside surface of the body formed along a width direction of the body.

Advantageous Effects of Invention

According to embodiments, the light emitting device package according to embodiments of the present invention may improve a luminous flux by adjusting an arrangement of the light emitting devices, an inclination angle of an inside surface of the body, a shape of the electrode separating member, and a location of the Zener diode.

Here, the electrode separating member may be formed to have a diagonally tilted structure or at least one bended portion, and therefore the light emitting devices and the Zener diode may have an adequate separation distance. Accordingly, the loss of light generated in the light emitting devices by the Zener diode may be prevented.

Further, according to an arrangement of the light emitting devices, a first inclination angle between a first inside surface of the body 100 formed along a length direction of the body and a bottom surface of the cavity may be different from a second inclination angle between a second inside surface of the body formed along a width direction of the body and the bottom surface of the cavity, and therefore efficiency of reflection by a reflecting member formed on an inside surface of the body may be improved.

BRIEF DESCRIPTION OF DRAWINGS

FIG. 1A is a plan view of a light emitting device package according to an embodiment of the present invention.

FIG. 1B is a cross-sectional view taken along line I-I' of FIG. 1A.

FIG. 1C is a cross-sectional view taken along line II-II' of FIG. 1A.

FIG. 1D is a plan view in which an electrode separating member in FIG. 1A is enlarged.

FIG. 2 is a plan view of a light emitting device package in which an electrode separating member is formed parallel to a width direction of a body.

FIG. 3 is a plan view of a conventional light emitting device package in which a first light emitting device and a second light emitting device are disposed parallel to a width direction of the body.

FIG. 4 is a plan view illustrating another form of the electrode separating member in FIG. 1A.

FIGS. 5A and 5B are plan views of light emitting device packages according to other embodiments of the present invention.

MODE FOR THE INVENTION

While the present invention may have various modifications added and a number of embodiments, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept.

It will be understood that, although the terms "first," "second," etc. may be used herein to describe various components, these components should not be limited by these terms. These terms are only used to distinguish one component from another component. For example, a first component discussed below could be termed a second component, and, likewise, the second component discussed below could be termed the first component without departing from the teachings of the present inventive concept. The "and/or" language includes combinations of listed items or one of the listed items.

It should be understood that when an element is referred to as being "connected" or "coupled" to another element, it can be directly connected to the another element or may be coupled to the other element but intervening elements may also be present. In contrast, when an element is referred to as being "directly connected" or "directly coupled" to another element, it should be understood as there being no intervening elements.

The terminology used herein to describe embodiments of the inventive concept is not intended to limit the scope of the inventive concept. Elements of the inventive concept referred to in the singular may number one or more, unless the context clearly indicates otherwise. It will be further understood that the terms "comprise", "have", etc. when used herein, specify the presence of stated features, numbers, steps, operations, elements, components, and/or groups thereof and do not preclude the presence or addition of one or more other features, numbers, steps, operations, elements, components, and/or groups thereof.

In the description of embodiments, when it is described that one element is "on or under" another element, the "on or under" includes the case that two elements directly contact to each other and the case that at least one other element is disposed between the two elements (indirectly). Further, when it is expressed using "on or under", a meaning of a downward direction as well as an upward direction with respect to one element may be included.

Hereinafter, example embodiments are described with reference to the attached drawings, the same or corresponding elements will be given the same reference numbers regardless of drawing symbols, and overlapping descriptions will be omitted.

Hereinafter, a light emitting device package including multi light emitting devices according to an embodiment of the present invention will be described in detail.

FIG. 1A is a plan view of a light emitting device package according to an embodiment of the present invention. Further, FIG. 1B is a cross-sectional view taken along line I-I' of FIG. 1A, and FIG. 1C is a cross-sectional view taken along line II-IF of FIG. 1A.

As shown in FIG. 1A, a light emitting device package according to an embodiment of the present invention includes a body 100 including a cavity 110, a first lead frame 120a and a second lead frame 120b exposed by the cavity 110 and separated from each other by an electrode separating member 130, a first light emitting device 140a disposed on the first lead frame 120a, a second light emitting device 140b disposed on the second lead frame 120b, and a Zener diode 150 disposed on the first lead frame 120a or the second lead frame 120b and formed closer to the electrode separating member 130 than to the first light emitting device 140a and the second light emitting device 140b.

The body 100 may be formed with at least one selected from silicon, silicon carbide (SiC), aluminum nitride (AlN), poly phthalamide (PPA), an epoxy molding compound (EMC), a liquid crystal polymer, etc., and is not limited thereto. The body 100 may be formed using methods such as injection, etching, etc.

When the body 100 is formed with a conductive material, an insulator film (not shown) is further formed on an inside surface and may prevent the body 100 and the light emitting device 140a and 140b from being electrically connected. Further, while the drawing shows an upper portion of the body 100 that has a rectangular shape with curved corners, the shape of the body 100 may also be polygonal or circular with a curved surface.

The cavity 110 may have an upper portion with an open shape, the shape of the upper portion may be circular, polygonal, oval, etc., and a structure having curved corners is shown in the drawing.

The first lead frame 120a and the second lead frame 120b exposed by the cavity 110 are separated by the electrode separating member 130. The first lead frame 120a and the second lead frame 120b may include at least one material or alloy of titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), and iron (Fe). Further, in the drawing, the first lead frame 120a and the second lead frame in a single layer structure is shown, however, the first lead frame 120a and the second lead frame 120b may be formed in a multiple layer structure.

The electrode separating member 130 may be disposed between the first lead frame 120a and the second lead frame 120b and may electrically and physically separate the first lead frame 120a and the second lead frame 120b. Accordingly, the electrode separating member 130 may be formed with an insulating material such as silicon, silicon carbide (SiC), aluminum nitride (AlN), poly phthalamide (PPA), an epoxy molding compound (EMC), a liquid crystal polymer, etc.

The first light emitting device 140a and the second light emitting device 140b disposed respectively on the first lead frame 120a and the second lead frame 120b, though not shown, may be configured to include a first semiconductor layer, a second semiconductor layer, and an active layer. Particularly, the first light emitting device 140a may be die-bonded to the first lead frame 120a and wire-bonded to the second lead frame 120b, and the second light emitting device 140b may be die-bonded to the second lead frame 120b and wire-bonded to the first lead frame 120a.

The first semiconductor layer may be implemented with a compound semiconductor such as III-V semiconductor, II-VI semiconductor, etc., and a first conductive dopant may be doped in the first semiconductor layer. For example, the first semiconductor layer may be a semiconductor having an empirical formula of $In_xAl_yGa_{1-x-y}N$ ($0 \leq x \leq 1$, $0 \leq y \leq 1$, $0 \leq x+y \leq 1$) and may be doped with n-type dopants such as Si, Ge, Sn, etc.

The active layer may generate light using energy generated in the process of recombination of electrons and holes provided by the first semiconductor layer and the second semiconductor layer. The active layer may be a compound semiconductor, for example, a compound semiconductor such as 3-5 group, 2-6 groups, etc. and may be formed with a single-well structure, a multiple-well structure, a quantum-wire structure, or a quantum-dot structure, etc. When the active layer is a quantum-well structure, the active layer may have the single-well structure or the quantum-well structure in which a well layer has an empirical formula of $In_xAl_yGa_{1-x-y}N$ ($0 \leq x \leq 1$, $0 \leq y \leq 1$, $0 \leq x+y \leq 1$) and a barrier layer has an empirical formula of $In_aAl_bGa_{1-a-b}N$ ($0 \leq a \leq 1$, $0 \leq b \leq 1$, $0 \leq a+b \leq 1$). The well layer may be a material having an energy band gap smaller than the energy band gap of the barrier layer.

The second semiconductor layer may be implemented with a compound semiconductor such as III-V semiconductor, II-VI semiconductor, etc., and second conductive dopants may be doped in the second semiconductor layer. For example, the second semiconductor layer may be a semiconductor having an empirical formula of $In_xAl_yGa1$-x-yN ($0 \leq x \leq 1$, $0 \leq y \leq 1$, $0 \leq x+y \leq 1$) and may be doped with p-type dopants such as Mg, Zn, Ca, Sr, Ba, etc.

Here, an angle between the inside surface of the body 100 exposed by the cavity 110 and the first lead frame 120a or the second lead frame 120b will be described below.

As shown in FIGS. 1B and 1C, a first inclination angle $\theta 1$ between a first inside surface 110a of the body 100 formed along a length direction of the body 100 and the first lead frame 120a or the second lead frame 120b is different from a second inclination angle $\theta 2$ between a second inside surface 110b of the body 100 formed along a width direction of the body 100 and the first lead frame 120a or the second lead frame 120b. Particularly, the first inclination angle $\theta 1$ is greater than the second inclination angle $\theta 2$.

The light emitting device package according to an embodiment of the present invention may improve a luminous flux emitting through the cavity 110 by adjusting the first inclination angle $\theta 1$ and the second inclination angle $\theta 2$.

Specifically, a reflecting member (not shown) may be formed on the inside surface of the body 100 exposed by the cavity 110 to reflect light generated by the light emitting devices 140a and 140b. Further, the light emitted from the light emitting devices 140a and 140b is reflected by the reflecting member (not shown) and emitted outside through the cavity 110.

When the first inclination angle $\theta 1$ of the first inside surface 110a is greater than the second inclination angle $\theta 2$ of the second inside surface 110b, an area of the first inside surface 110a is greater than an area of the second inside surface 110b. Therefore, when the first light emitting device 140a and the second light emitting device 140b are disposed parallel to a length direction of the body 100, light emitted from the first light emitting device 140a and the second light emitting device 140b is easily reflected by the first inside surface 110a having a greater area, and therefore the amount of light emitted through the cavity 110 increases. Accordingly, a luminous flux of a light emitting device package may be improved.

For example, the first inclination angle $\theta 1$ of the first inside surface 110a may be selected from a range of 146° to 149° and preferably 146° or 149°. Further, the second inclination angle $\theta 2$ of the second inside surface 110b is a range of 115° to 145° and preferably may be selected from angles 117°, 132°, and 141°.

Furthermore, an upper surface of the first lead frame 120a and the second lead frame 120b is a flat type, and therefore light emitted from the first light emitting device 140a and the second light emitting device 140b may easily propagate to an inside surface of the body 100.

Particularly, when the first lead frame 120a and the second lead frame 120b has a cup-type structure which has a level difference, areas of inside surfaces of the body 100 opposite to each other are different, and the amount of light emitted from the cavity 110 is partially different. Therefore, a property of light according to angle of beam spread may be degraded. On the other hand, in the present invention, upper surfaces of the first lead frame 120a and the second lead frame 120b are flat, and therefore areas of inside surfaces of the body 100 opposite to each other is the same, and accordingly a property of light according to angle of beam spread is improved.

Further, the Zener diode 150 may be disposed on one lead frame selected from the first lead frame 120a and the second lead frame 120b, so that the light emitting devices 140a and 140b may be protected from an electrostatic discharge (ESD). In the drawing, the Zener diode 150 disposed on the first lead frame 120a is shown. In this case, the Zener diode 150 may be die-bonded to the first lead frame 120a and be wire-bonded to the second lead frame 120b.

Here, in order to reduce the length of wire connecting the Zener diode 150 to each of the first lead frame 120a and the second lead frame 120b, the Zener diode 150 is disposed between the first lead frame 120a and the second lead frame 120b so that the Zener diode 150 is adjacent to the electrode separating member 130. Furthermore, it is preferable that the Zener diode 150 is disposed closer to the electrode separating member 130 than to the first light emitting device 140a and the second light emitting device 140b, so that a loss of light emitted from the first light emitting device 140a and the second light emitting device 140b due to an absorption by the Zener diode 150 is prevented.

FIG. 1D is a plan view in which an electrode separating member in FIG. 1A is enlarged.

As shown in FIG. 1D, when the electrode separating member 130 is formed in a diagonally tilted structure along a width direction of the body 100, both ends of the electrode separating member 130 may have a first included angle $\theta$ and a second included angle $180°-\theta$ formed with a first inside surface 110a of the body 100. Here, the Zener diode 150 may be disposed in an area having a smaller included angle of the first included angle $\theta$ and the second included angle $180°-\theta$. For example, when the first included angle $\theta$ is 45, the Zener diode 150 may be formed in area a or area b.

Here, the separation distance d between a side surface of the Zener diode 150 and the inside surface of the body 100 is 150 µm or more, and the separation distance d' between the side surface of the Zener diode 150 and the electrode separating member 130 is also 150 µm or more. A diameter of the Zener diode 150 is about 300 µm including a die bonding connected to the first lead frame 120a or the second lead frame 120b, and therefore it is preferable to include a bonding area when considering the separation distance d.

Further, it is preferable that the separation distance d" between the first light emitting device 140a or the second light emitting device 140b and the first inside surface 110a is 1000 µm to 3000 µm. The reason is that when the separation distance d" between the first light emitting device 140a or the second light emitting device 140b and the first inside surface 110a is too large, it is not easy to adjust the first inclination angle $\theta 1$, and when the separation distance d" between the first light emitting device 140a or the second light emitting device 140b and the first inside surface 110a is too small, a processing margin for forming the first light emitting device 140a and the second light emitting device 140b cannot be obtained.

Further, the width of the electrode separating member 130 may be 250 µm to 400 µm. The reason is that when the width of the electrode separating member 130 is too large, areas of the first lead frame 120a and the second lead frame 120b on which the first light emitting device 140a, the second light emitting device 140b, and the Zener diode 150 are formed may be small, and when the width of the electrode separating member 130 is too small, a problem that the first lead frame 120a and the second lead frame 120b are shorted may occur. Therefore, it is most preferable that the width of the electrode separating member 130 is 300 µm.

FIG. 2 is a plan view illustrating a light emitting device package in which an electrode separating member is formed parallel to a width direction of a body.

As shown in FIG. 2, when the electrode separating member 130 is formed parallel to a width direction of the body 100, even when the Zener diode 150 is formed maximally separated from the first light emitting device 140a or the second light emitting device 140b, a distance d1 between the Zener diode 150 and the first light emitting device 140a is smaller than the distance d2 between the Zener diode 150 and the first light emitting device 140a shown in FIG. 1A.

Therefore, as the light emitting device package according to embodiments of the present invention, when the first light emitting device 140a and the second light emitting device 140b are formed parallel to a length direction of the body 100, it is preferable that the electrode separating member 130 is formed to have a structure in which the electrode separating member 130 is tilted so that the first light emitting device 140a and the second light emitting device 140b are formed maximally separated from the Zener diode 150. Further, when both ends of the electrode separating member 130 have a first included angle θ and a second included angle 180°−θ formed with a first inside surface 110a of the body 100, the Zener diode 150 is disposed in an area having a smaller included angle of the first included angle θ and the second included angle 180°−θ.

FIG. 3 is a plan view illustrating a general light emitting device package in which a first light emitting device and a second light emitting device are disposed parallel to a width direction of the body.

As shown in FIG. 3, when the first light emitting device 140a and the second light emitting device 140b are formed parallel to (e.g., aligned along) a width direction of the body 100, the first light emitting device 140a and the second light emitting device 140b are both formed on the same lead frame, that is, in the drawing, in the second lead frame 120b. That is, the first light emitting device 140a and the second light emitting device 140b have the same polarity, and therefore two Zener diodes should be disposed on the first lead frame 120a. Therefore, fabrication cost of a light emitting device increases.

Further, a distance between the first light emitting device 140a or the second light emitting device 140b and a second inside surface 110b in a length direction of the body 100 is large. Therefore, it is difficult to have light emitted from the first light emitting device 140a and the second light emitting device 140b be reflected upwards by a reflecting member (not shown) formed on an inside surface of the cavity 110. Furthermore, when the first light emitting device 140a and the second light emitting device 140b are formed parallel to a width direction of the body 100, the first lead frame 120a and the second lead frame 120b have a level difference, and therefore the reflection area of an inside surface of the body 100 in which the Zener diode 150 is disposed decreases.

On the contrary, the light emitting device package according to embodiments of the present invention have the first light emitting device 140a and the second light emitting device 140b formed parallel to a length direction of the body 100 as shown in FIG. 1A. Therefore, a distance between the first light emitting device 140a or the second light emitting device 140b and the second inside surface 110b becomes smaller, and thus an effect of light collection is maximized. At the same time, an area of the first inside surface 110a becomes larger so that distribution and concentration of light emitted from the cavity 110 is improved, and accordingly luminous flux is improved.

For example, when FIG. 3 and FIG. 1A include a light emitting device having a length of 1000 µm and a width of 550 µm and a light emitting device package having a length of 5600 µm and a width of 3000 µm, a luminous flux of the light emitting device package of the embodiments of the present invention is improved to about 103.5% compared with that of FIG. 3.

Table 1 illustrates concrete examples of the light emitting device package of the present invention of FIG. 1A.

TABLE 1

|  | Example 1 | Example 2 | Example 3 | Example 4 |
|---|---|---|---|---|
| Length of light emitting device package (µm) | 5300 | 5300 | 5300 | 5300 |
| width of light emitting device package (µm) | 3000 | 3000 | 3000 | 3000 |
| Length of bottom surface of cavity (µm) | 4250 | 4250 | 3890 | 3630 |
| width of bottom surface of cavity (µm) | 880 | 1080 | 880 | 880 |
| Inclination angle between bottom surface of body and first inside surface of body (θ) | 149° | 146° | 149° | 149° |
| Inclination angle between bottom surface of body and second inside surface of body (θ) | 117° | 117° | 132° | 141° |

As described above, in the light emitting device according to embodiments of the present invention, the first light emitting device 140a and the second light emitting device 140b are formed parallel to a length direction of the cavity 110, and therefore the light emitting device may improve a luminous flux of a light emitting device package by adjusting an inclination angle between the first inside surface 110a or the second inside surface 110b and the bottom surface of the cavity 110.

FIG. 4 is a plan view illustrating another form of an electrode separating member in FIG. 1A.

As shown in FIG. 4, the electrode separating member 130 may be formed to have a bent structure in which a vertical portion 130a and a diagonal portion 130b are included between the first light emitting device 140a and the second light emitting device 140b. The diagonal portion 130b has a first included angle θ and a second included angle 180°−θ formed with a side surface of the body 100, and the Zener diode may be disposed in an area having a smaller included angle among the first included angle θ and the second included angle 180°−θ. Here, the Zener diode 150 may be disposed to be maximally separated from the first light emitting device 140a or the second light emitting device 140b and closest to the side surface of the body 100 and the side surface of the electrode separating member 130.

Particularly, to obtain an adequate separation distance between the Zener diode 150 and the first light emitting device 140a or the second light emitting device 140b, a groove 110h may be further formed on the side surface of the cavity 110, and the Zener diode 150 may be disposed in the groove 110h.

FIGS. 5A and 5B are plan views illustrating light emitting device packages according to other embodiments of the present invention.

As shown in FIGS. 5A and 5B, a groove 110h recessed into a direction of the inside of the body 100 may be formed on an inside surface of the body 100 adjacent to both ends of the electrode separating member 130, and the Zener diode 150 may be disposed in the groove 110h. This is for increasing a separation distance between the first light emitting device 140a or the second light emitting device 140b and the Zener diode 150. Further, when the Zener diode 150 is disposed to have a structure in which the Zener diode 150 is inserted in the groove 110h, the loss of the light generated in the first light emitting device 140a and the second light emitting device 140b due to the Zener diode 150 which does not participate in light emission may be effectively prevented.

Particularly, the Zener diode 150 may be entirely inserted in the groove 110h, however, when the Zener diode 150 is entirely inserted in the groove 110h, during wire bonding the Zener diode 150 and a lead frame, a length of a wire may become long and therefore be disconnected. Therefore, as shown in the drawings, it is preferable that only a portion of the Zener diode 150 is inserted. Accordingly, it is preferable that a diameter of the groove 110h is not beyond a diameter of the Zener diode 150 including a bonding area.

Further, the groove 110h, as shown in the drawings, may be formed only in an area in which the Zener diode 150 is disposed, or may be formed on an inside surface of the body 100 opposite to the Zener diode 150.

Here, the separation distance between a side surface of the Zener diode 150 and the inside surface of the body 100 is 150 μm or more, and the separation distance between the side surface of the Zener diode 150 and the electrode separating member 130 is also 150 μm or more. A diameter of the Zener diode 150 is about 300 μm including a die bonding connected to the first lead frame 120a or the second lead frame 120b, and therefore it is preferable to include a bonding area when considering the separation distance d.

That is, the light emitting device package according to embodiments of the present invention as described above may improve a luminous flux by adjusting an arrangement of the light emitting devices 140a and 140b, an inclination angle of an inside surface of the body 100, a shape of the electrode separating member 130, and a location of the Zener diode 150. Particularly, the electrode separating member 130 may be formed to have a structure in which the electrode separating member 130 diagonally separates the first lead frame 120a and the second lead frame 120b along a width direction of the body 100, or the electrode separating member 130 may have a bent structure in which a diagonal portion and a vertical portion are included. Therefore, the first light emitting device 140a and the second light emitting device 140b may have an enough separation distance from the Zener diode 150. Accordingly, the loss of light generated in the first light emitting device 140a and the second light emitting device 140b by the Zener diode 150 may be prevented.

Further, according to an arrangement of the light emitting devices 140a and 140b, a first inclination angle θ1 between a first inside surface 110a of the body 100 formed along a length direction of the body 100 and a bottom surface of the cavity 110 may be different from a second inclination angle θ2 between a second inside surface 110b of the body 100 formed along a width direction of the body 100 and the bottom surface of the cavity 110, and therefore efficiency of reflection by a reflecting member (not shown) formed on an inside surface of the body 100 may be improved.

The light emitting device package according to embodiments of the present invention as described above may further include optical members such as a light guide plate, a prism sheet, a spread sheet, etc., and may function as a backlight unit. Further, the light emitting device package according to embodiments of the present invention may be further applied to a display device, an illumination system, and a designating device.

Here, the display device may include a bottom cover, a reflecting plate, a light emitting module, a light guide plate, an optical sheet, a display panel, an image signal output circuit, and a color filter. The bottom cover, the reflecting plate, the light emitting module, a light guide plate, and an optical sheet may compose the backlight unit.

The reflecting plate is disposed on the bottom cover, and the light emitting module emits light. The light guide plate is disposed in front of the reflecting plate and guides light emitted forward from a light emitting device, and the optical sheet includes a prism sheet, etc. and is disposed in front of the light guide plate. The display panel is disposed in front of the optical sheet, the image signal output circuit provides image signals to the display panel, and the color filter is disposed in front of the display panel.

Further, the illumination system may include a light source module including a substrate and a light emitting device package according to embodiments, a radiator unit which radiates heat of the light source module, and a power supply unit which processes or converts an electrical signal provided from an external to provide to the light source module. Further, the illumination system may include a lamp, a head lamp, or a streetlamp, etc.

Particularly, as described above, in the light emitting device package according to embodiments of the present invention, the first light emitting device 140a and the second light emitting device 140b is formed parallel to a length direction of the body, therefore, a distance between the first light emitting device or the second light emitting device and the inside surface of the body becomes smaller, thus an effect of light collection may be maximized, and accordingly a luminous flux may be improved. Accordingly, the light emitting device package according to embodiments of the present invention may be efficiently applied to illumination requiring a high light collecting efficiency or a device such as a miniaturized instrument in which light is concentrated in a unit area.

The present invention described above is not be limited by the above-described embodiments and the attached drawings. It will be understood by those skilled in the art that various modifications can be made without departing from the scope of the present invention and without changing essential features.

The invention claimed is:

1. A light emitting device package, comprising:
   a body including a cavity;
   a first lead frame and a second lead frame exposed on a bottom surface of the cavity and separated from each other by an electrode separating member;
   a first light emitting device disposed on the first lead frame;
   a second light emitting device disposed on the second lead frame; and
   a Zener diode disposed on the first lead frame or the second lead frame, and disposed closer to the electrode separating member than to the first light emitting device and the second light emitting device, wherein the electrode separating member diagonally separates the first lead frame and the second lead frame along a width direction of the body, wherein the first light emitting device and the second light emitting device are disposed along a length direction of the body, wherein the body includes a first inside surface of the body formed along the length direction of the body, a second inside surface of the body formed along the width direction of the body, and a groove formed on the first inside surface of the body, wherein an area of the first inside surface of the body is greater than an area of the second inside surface of the body, and wherein the groove is recessed in a lateral direction into the first inside surface and the Zener diode is disposed in the groove.

2. The light emitting device package of claim 1, wherein a first inclination angle between the bottom surface of the cavity and the first inside surface is different from a second inclination angle between the bottom surface of the cavity and the second inside surface.

3. The light emitting device package of claim 2, wherein the first inclination angle is greater than the second inclination angle.

4. The light emitting device package of claim 2, wherein a separation distance between the first inner surface and each of the first light emitting device and the second light emitting device is 1000 μm to 3000 μm.

5. The light emitting device package of claim 2, wherein the first inclination angle is selected from a range of 146° to 149°, and the second inclination angle is selected from a range of 115° to 145°.

6. The light emitting device package of claim 5, wherein the first inclination angle is selected from angles 146° and 149°, and the second inclination angle is selected from angles 117°, 132°, and 141°.

7. The light emitting device package of claim 1, wherein the Zener diode is disposed between the first light emitting device and the second light emitting device so that the Zener diode is adjacent to the electrode separating member.

8. The light emitting device package of claim 1, wherein both ends of the electrode separating member have a first included angle and a second included angle formed with the first inside surface, and the Zener diode is disposed in an area having a smaller included angle of the first included angle and the second included angle.

9. The light emitting device package of claim 8, wherein the Zener diode is disposed to be adjacent to the electrode separating member and the first inside surface in the area having a smaller included angle.

10. The light emitting device package of claim 1, wherein the electrode separating member has a bent structure which has a diagonal portion and a vertical portion.

11. The light emitting device package of claim 10, wherein the vertical portion is provided near a center of the electrode separating member and the diagonal portion is configured to have structures extended from lateral ends of the vertical portion toward the first inside surface.

12. The light emitting device package of claim 10, wherein the diagonal portion of the electrode separating member has a first included angle and a second included angle formed with the first inside surface, and the Zener diode is disposed in an area having a smaller included angle of the first included angle and the second included angle.

13. The light emitting device package of claim 12, wherein the Zener diode is disposed to be adjacent to the electrode separating member and the first inside surface in the area having a smaller included angle.

14. The light emitting device package of claim 1, wherein the electrode separating member has a width in a range of 250 μm to 400 μm.

15. The light emitting device package of claim 1, wherein a depth of the groove is smaller than a diameter of the Zener diode.

16. The light emitting device package of claim 1, wherein only a portion of the Zener diode is disposed in the groove.

17. The light emitting device package of claim 1, wherein the Zener diode is adjacent to the first inside surface of the body formed along a length direction of the body and the electrode separating member so that the Zener diode is maximally separated from the first light emitting device and the second light emitting device, and a separation distance between the Zener diode and the first inside surface and a separation distance between the Zener diode and the electrode separating member are at least 150 μm.

* * * * *